United States Patent
Beringov et al.

(10) Patent No.: US 9,039,835 B2
(45) Date of Patent: May 26, 2015

(54) APPARATUS FOR PRODUCING MULTICRYSTALLINE SILICON INGOTS BY INDUCTION METHOD

(75) Inventors: Sergii Beringov, Kiev (UA); Volodymyr Onischenko, Kiev (UA); Anatoly Shkulkov, St. Petersburg (RU); Yuriy Cherpak, Kiev (UA); Sergii Pozigun, Dnepropetrovsk (UA); Stepan Marchenko, Kiev (UA); Bogdan Chepurnyy, Kiev (UA)

(73) Assignee: SoLin Development B.V., Amsterdam Zuldoost (NL)

( * ) Notice: Subject to any disclaimer, the term of this patent is extended or adjusted under 35 U.S.C. 154(b) by 798 days.

(21) Appl. No.: 13/386,197

(22) PCT Filed: Jul. 19, 2010

(86) PCT No.: PCT/UA2010/000045
§ 371 (c)(1),
(2), (4) Date: Jan. 20, 2012

(87) PCT Pub. No.: WO2011/010982
PCT Pub. Date: Jan. 27, 2011

(65) Prior Publication Data
US 2012/0174630 A1    Jul. 12, 2012

(30) Foreign Application Priority Data

Jul. 20, 2009  (UA) .................................. 200907630

(51) Int. Cl.
*C30B 13/14*    (2006.01)
*C30B 15/10*    (2006.01)
(Continued)

(52) U.S. Cl.
CPC ................ *C30B 29/06* (2013.01); *C30B 13/14* (2013.01); *Y10T 117/10* (2015.01);
(Continued)

(58) Field of Classification Search
CPC ...... C30B 11/002; C30B 13/14; Y10T 117/10
USPC ........................ 117/30, 51, 52, 200, 222, 901
See application file for complete search history.

(56) References Cited

U.S. PATENT DOCUMENTS 4,660,212 A * 4/1987 Boen et al. ..................... 373/156
4,838,933 A * 6/1989 Paillere et al. ................. 164/471
(Continued)

*Primary Examiner* — Matthew Song
(74) *Attorney, Agent, or Firm* — Weiner & Burt, P.C.; Irvine M. Weiner; Pamela S. Burt

(57) ABSTRACT

An apparatus for producing multicrystalline silicon ingots by the induction method comprises an enclosure, which includes means for start-up heating of silicon and a cooled crucible enveloped by an inductor. The crucible has a movable bottom and four walls consisting of sections spaced apart by vertically extending slots, means for moving the movable bottom, and a controlled cooling compartment arranged under the cooled crucible. The inside face of the crucible defines a melting chamber of a rectangular or square cross-section. The walls of the cooled crucible extend outwards at least from the inductor toward the lowest portion of the cooled crucible to thereby expand the melting chamber, and the angle β of expanding the melting chamber is defined by the equation β=arctg[2·(k−1.35·10 3·b)/d], where d is the dimension of the smaller side of the rectangle or of the side of the square of the cross-section of the melting chamber at the inducer level, b is the dimension of the adjoining side of the cross-section of the melting chamber at the inducer level, k is an empirical coefficient, which is 1.5 to 2. The apparatus makes it possible to decrease silicon melt spills and to increase the quality of multicrystalline silicon thus produced.

2 Claims, 3 Drawing Sheets

(51) Int. Cl.
  *C30B 35/00* (2006.01)
  *C30B 29/06* (2006.01)
  *C30B 11/00* (2006.01)
  *C30B 28/06* (2006.01)

(52) U.S. Cl.
  CPC ............ *C30B 11/001* (2013.01); *C30B 11/003* (2013.01); *C30B 28/06* (2013.01); *Y10S 117/901* (2013.01)

(56) References Cited

U.S. PATENT DOCUMENTS

| | | | |
|---|---|---|---|
| 5,636,241 A * | 6/1997 | Yamada et al. | 373/156 |
| 7,000,678 B1 * | 2/2006 | Mon et al. | 164/507 |
| 2005/0175064 A1 * | 8/2005 | Keough | 373/151 |
| 2008/0179037 A1 * | 7/2008 | Yoshihara et al. | 164/460 |
| 2009/0038772 A1 * | 2/2009 | Kunii et al. | 164/493 |

* cited by examiner

A−A

APPARATUS FOR PRODUCING MULTICRYSTALLINE SILICON INGOTS BY INDUCTION METHOD

TECHNICAL FIELD

This invention relates to apparatus for producing multicrystalline silicon ingots by the induction method and can be used in the manufacture of solar cells from multicrystalline silicon.

BACKGROUND ART

Solar cells that produce electricity from the sun's rays are built of crystalline silicon, both monocrystalline and multicrystalline, i.e., polycrystalline silicon consisting of large crystals.

Interest to multicrystalline silicon has been ever growing because multicrystalline silicon solar cells efficiency is close to that of monocrystalline silicon solar cells, while the multicrystalline silicon growing equipment productivity is several times as high as that of monocrystalline silicon growing equipment. Also, multicrystalline silicon growing is simpler than monocrystalline silicon growing.

Known in the art is an apparatus for producing multicrystalline silicon ingots by the induction method, which apparatus comprising a chamber wherein installed is a cooled crucible enveloped by an inductor and having a movable bottom and four walls consisting of sections spaced apart by vertically extending slots. There is also a set of heating means for controlled cooling of the ingot (EP No. 1754806, published 21.02.2007, cl. S30B 11/00) [1]. Also, the apparatus is equipped with a separate partition means capable of being installed on the crystallized ingot in the melting space of the cooled crucible and further heating the lump silicon charge, melting and casting above the top level of the partition device.

A disadvantage of the known apparatus resides in the multicrystalline silicon low productivity and non sufficient quality of obtained multicrystalline silicon. Multicrystalline silicon has a large number of defects in the crystal structure.

An apparatus for producing multicrystalline silicon ingots by the induction method bearing closely on the invention comprises an enclosure, which includes means for start-up heating of silicon, a cooled crucible enveloped by an inductor and having a movable bottom and four walls consisting of sections spaced apart by vertically extending slots, means for moving the movable bottom, and a controlled cooling compartment arranged under the cooled crucible wherein the inside face thereof defines a melting chamber of a rectangular or square cross-section and the walls of the cooled crucible extend outwards at least from the inductor toward the lowest portion of the cooled crucible to thereby expand the melting chamber, (EP 0349904 published 10 Jan. 1990, cl. B22D 11/10) [2]. The angle of expanding the melting chamber is from 0.4 to 2°.

A disadvantage of the known apparatus resides in a decreased quality of multicrystalline silicon ingot and a decrease in productivity of the manufacture of multicrystalline silicon ingots due to frequent silicon melt spills.

DISCLOSURE OF INVENTION

The present invention aims at providing an improved apparatus for producing multicrystalline silicon ingots by the induction method, in which, by proposed structural changes, the silicon melt spilling is reduced to thus obtain multicrystalline silicon of better quality and to enhance multicrystalline silicon productivity.

This objective is achieved by providing an apparatus for producing multicrystalline silicon ingots by the induction method, comprising an enclosure, which includes means for start-up heating of silicon, a cooled crucible enveloped by an inductor and having a movable bottom and four walls consisting of sections spaced apart by vertically extending slots, means for moving the movable bottom, and a controlled cooling compartment arranged under the cooled crucible wherein the inside face thereof defines a melting chamber of a rectangular or square cross-section and the walls of the cooled crucible extend outwards at least from the inductor toward the lowest portion of the cooled crucible to thereby expand the melting chamber. According to the invention, each wall of the cooled crucible has a central section providing the absence of a vertically extending slot at the middle of a side of the melting chamber, and the angle $\beta$ of expanding the melting chamber is defined by the equation $$\beta = \text{arctg}\,[2 \cdot (k - 1.35 \cdot 10^{-3} \cdot b)/d],$$

where
d is the dimension of the smaller side of the rectangle or of the side of the square of the cross-section of the melting chamber at the inducer level,
b is the dimension of the adjoining side of the cross-section of the melting chamber at the inducer level,
k is an empirical coefficient, which is 1.5 to 2.

Coefficient k has the biggest values where the perimeter of the ingot being grown is long.

The width of the central section of each wall of the cooling crucible is from $\frac{1}{6}$ to 1 of the dimension of the melting chamber side.

In the process of silicon melting and casting by induction melting in the cooled crucible bottom with moving walls designed as water-cooled vertical sections of electro- and heat conductive material, meniscus formed by part of the melt is outpressed by electromagnetic forces from the crucible inner surface and gets balanced by its hydrostatic pressure. With a continuous supply of the raw material, the balance is broken and the lower level of the meniscus is periodically poured towards the inner surface of the cooled crucible where the melt crystallizes and the wall accretion forms on the perimeter of the cooled crucible to hold the silicon melt and prevent its contact with the crucible.

As the melting process proceeds and the ingot moves downwards, the wall accretion becomes thicker. The temperature of the outer surface of the wall accretion bearing on the crucible is lower than the silicon melting point and depends on its thermal conductivity and heat transfer to the walls of the crucible, while the inner surface of the wall accretion has a temperature equal to the melting point of silicon. The wall accretion thus formed has a temperature gradient both in the cross section and in the height of the melt bath.

In the production of multicrystalline silicon ingots by induction melting, the melt spills into the gap between the wall accretion and the cooled crucible are due to several factors.

One of the factors is associated with the transverse gradient of temperature across the wall accretion.

Due to the temperature gradient there occurs thermal shrinkage of the wall accretion. Also, at temperatures from 900° C. to 1050° C., which are higher than the silicon flow temperature, the wall accretion undergoes plastic deformation. The magnitude of thermal shrinkage of the wall accretion depends on the temperature gradient and size and shape of the melting chamber formed by the cooled crucible. Any excess of heat shrinkage over the permitted value leads to inadequate wall accretion cooling, its overheating, melting and spills into the gap between the wall accretion and the inner wall of the cooled crucible.

Another factor that leads to silicon spills into the gap between the wall accretion and the inner wall of the cooled crucible is in the breaking of the wall accretion when it catches on the cooled crucible inner walls. Liquid silicon does not wet the inside of the cooled crucible walls and does not stick to the walls when there are no defects on their surface. The main defects on the surface of the cooled crucible inner walls are vertical slots between the wall sections, which slots are necessary for the inductor electromagnetic field to penetrate into the silicon melt and to heat it.

It has been experimentally established that wall sections spaced apart by vertical slots and arranged on the perimeter of a rectangular or square shape to form four walls, each having a central section, which provides no vertical slot in the middle of the corresponding cooled crucible wall, and the size of the melting chamber formed by the walls of the cooled crucible being taken into account while expanding the melting chamber, stabilizes the formation of the gap as a result of the thermal shrinkage of the wall accretion in silicon induction melting, which provides for a decrease in silicon melt spills.

Moreover, the arrangement outlined provides for elimination of the wall accretion catching on the cooled crucible walls surface, including areas with the smallest gap between the wall accretion and cooled crucible wall surface, and allows for taking into account the thermal shrinkage and transverse dimensions of the multicrystalline silicon ingots obtained. As a result, silicon melt spills are significantly decreased and silicon crystallizes under stable conditions at a constant rate.

The enhancement of stability of the melting and crystallization process results in formation of large crystallites that produce multicrystalline silicon. Moreover, the stability of the crystallization process eliminates defects in the crystal structure to provide for quality products obtained therefrom, namely, solar cells.

Thus, the proposed design of the apparatus for producing multicrystalline silicon ingots provides for higher output of multicrystalline silicon suitable for solar cell production.

BRIEF DESCRIPTION OF DRAWINGS

The invention is further described with reference to, though not limited by, the following drawings, in which.

BEST MODE FOR CARRYING OUT THE INVENTION

Figure 1:
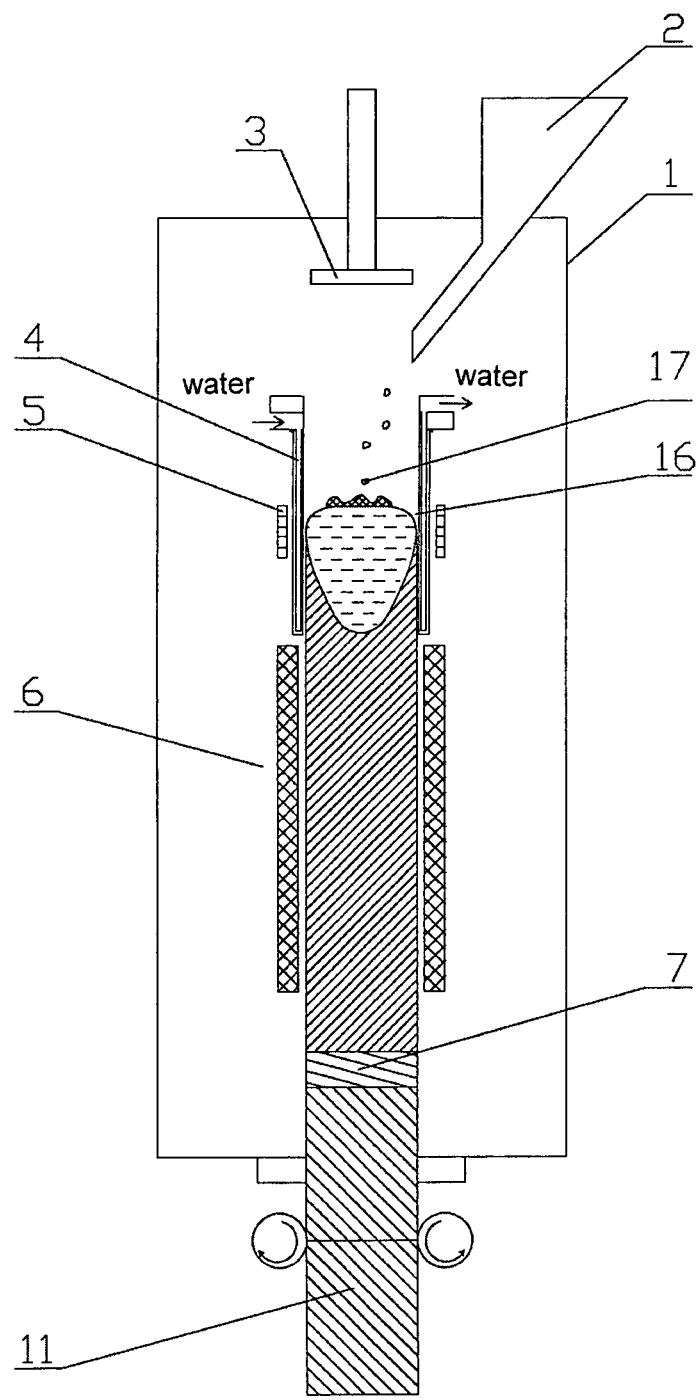
FIG. 1 is a longitudinal sectional view of an apparatus for producing multicrystalline silicon ingots by induction melting.

An apparatus for producing multicrystalline silicon ingots by induction melting (FIG. 1) includes an enclosure 1 communicating with a charging hopper 2. In the enclosure 1 there are means 3 for start-up heating of silicon, a cooled crucible 4 enclosed by an inductor 5, and a controlled cooling compartment 6 arranged below the cooled crucible 4. The cooled crucible 4 is defined by a movable bottom 7 and sections 8 and central sections 9 (FIG. 3) spaced apart by vertical slots 10. The movable bottom 7 associated with means 11 for moving the same vertically within the controlled cooling compartment 6. The sections 8 and central sections 9 spaced apart by vertical slots 10 form four mutually perpendicular walls 12, 13, 14, and 15. The inner surface of the cooled crucible 4 defines a melting chamber 16 of square or rectangular cross section, into which silicon lump material 17 is charged. The central section 9 of each wall 12, 13, 14, and 15 of the cooled crucible 4 provides no vertical slot in the middle of the side of the melting chamber 16. The sections 8 and central sections 9 of the walls 12, 13, 14, and 15 of the cooled crucible 4 (FIG. 2), by sloping outwards, expand the melting chamber 16 at least from the inductor 5 toward the lowest portion, or the bottom, of the cooled crucible 4, and the angle β of expanding the melting chamber is defined by the equation:

$$\beta = \text{arctg}\,[2 \cdot (k - 1.35 \cdot 10^{-3} \cdot b)/d],$$

where d is the dimension of the smaller side of the rectangle or of the side of the square of the cross-section of the melting chamber 16 at the level of the inducer 5, b is the dimension of the adjoining side of the cross-section of the melting chamber 16 at the level of the inducer level 5, k is an empirical coefficient, which is 1.5 to 2.

The central section 9 of each wall 12, 13, 14 and 15 of the cooled crucible 4 (FIG. 3) has a width of from ⅙ to 1 of the dimension of the side of the melting chamber 16.

The walls 12, 13, 14, and 15 of the cooled crucible 4 are detachably connected to a manifold 18. The manifold 18 provides supply, distribution and dispensing of a cooled liquid (water).

The walls 12, 13, 14, and 15 of the cooled crucible 4 are made of copper or an alloy based on copper, the means 3 for start-up heating of silicon and the movable bottom 7 are made of an electroconductive material such as graphite.

The apparatus of the invention operates as follows.

In the enclosure 1, a controlled atmosphere is created. The movable bottom 7 is moved to the top of the cooled crucible 4 to limit the melting space 16 from below. To the melting chamber 16, a silicon lump material 17 is added from the charging hopper 2 and the means 3 for start-up heating of silicon is brought in. The high-frequency electromagnetic field is created by the inductor 5. The movable bottom 7 and the means 3 for start-up heating of silicon are heated in the electromagnetic field of the inductor 5 and the silicon lump material 17 is heated due to heat transfer within the melting chamber 16. When the temperature reaches 700-800° C., the charge undergoes induction heating and melting.

Figure 2:
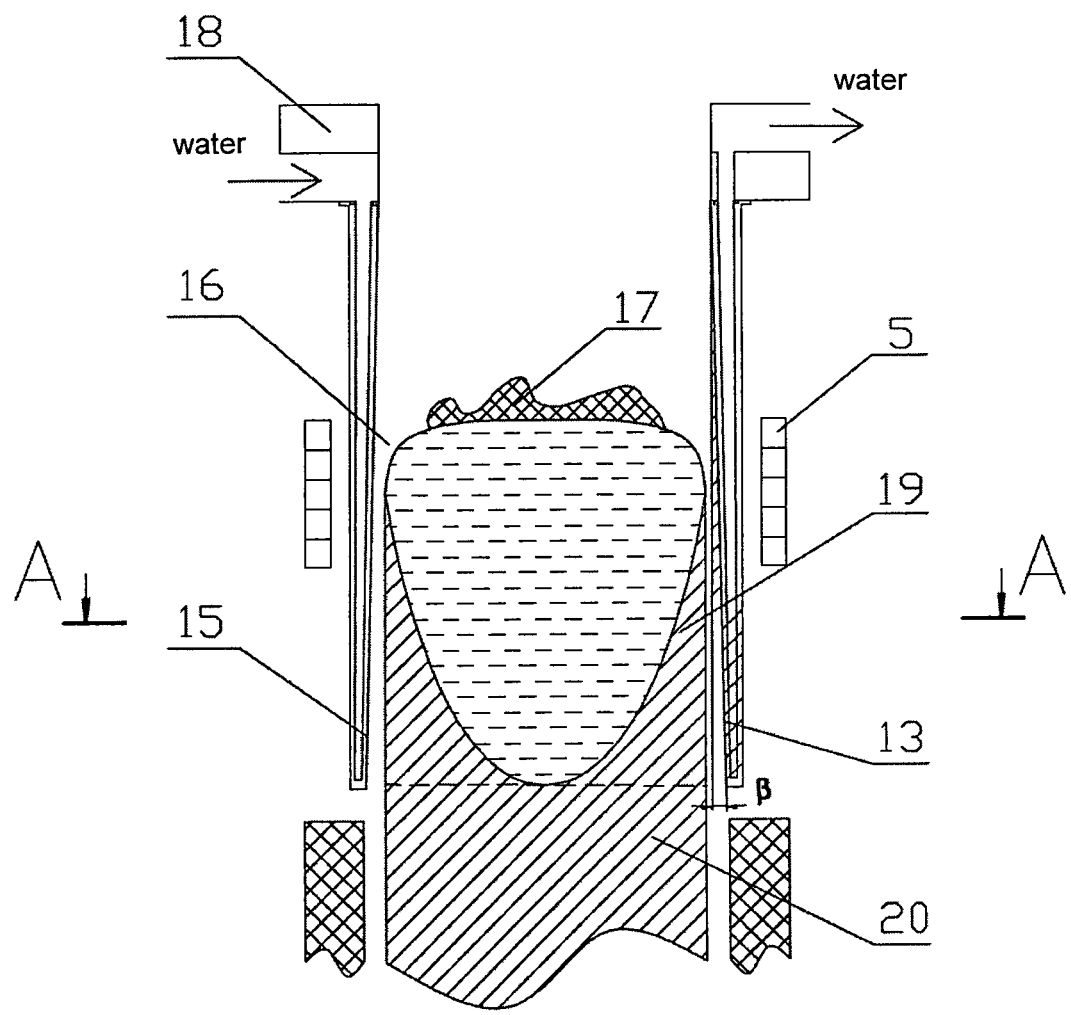
in FIG. 2 is a longitudinal sectional view of a cooled crucible containing a melt.
Figure 3:
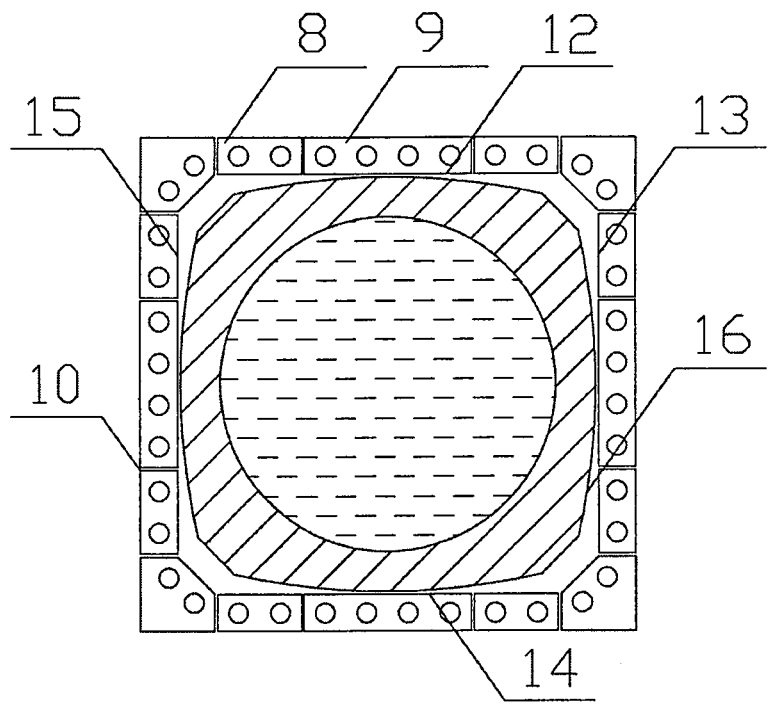
in FIG. 3 is a cross sectional view of the cooled crucible illustrating the melting chamber.

The means 3 for start-up heating of silicon is moved from the electromagnetic field of the inductor 5, and a silicon melt bath is formed in the melting chamber 16 in accordance with the form of its cross-section (FIG. 2, FIG. 3). As a result of the heat transfer, the silicon melt crystallizes and a wall accretion 19 is formed on the periphery of the melt bath near the walls of the cooled crucible 4. It keeps the melt from spilling from the melting space 16 and prevents the interaction of molten silicon with the walls 12, 13, 14, and 15 of the cooled crucible 4. Due to the electromagnetic field of the inductor 5 the upper melt bath is squeezed from the walls 12, 13, 14, and 15 of the cooled crucible 4 and a meniscus is formed, and the silicon lump material 17 is continuously fed from the charging hopper 2 onto the meniscus surface. The silicon lump material 17 is melted to increase the hydrostatic pressure of the meniscus. Periodically, when pressure equilibrium is upset, the melt is spilled over the upper end of the wall accretion toward the walls 12, 13, 14 and, 15 of the cooled crucible 4, the outer layer of the melt crystallizes, and the wall accretion 19 continuously grows. The movable bottom 7 is moved down from the inductor 5 zone, and the silicon melt continuously crystallizes at the lower portion thereof to form a multicrystalline ingot 20 as the melting process and ingot downward movement proceed. The multicrystalline ingot 20 continuously moves down to the controlled cooling compartment 6. The multicrystalline ingot 20 is withdrawn at such a rate that the melt bath remains relatively constant at the level of the inductor 5 and the cooled crucible 4 and the melt continuously crystallizes in the bottom portion of the bath to form the ingot. In the controlled cooling compartment 6, the ingot is cooled under controlled conditions and thermal stresses are removed.

Multicrystalline ingots that were obtained in the apparatus of the invention had cross-sectional sizes of 340×340 mm$^2$ and 340×530 mm$^2$.

Ingots of the cross-sectional size of 340×340 mm$^2$ were obtained in the in the melting chamber of a square cross-section with the side dimension of 342 mm at the level of the inductor. The width of the central section of the cooled crucible was 60 mm, so there was a vertical slot absent in the middle of the melting chamber side. The angle β of expanding the melting chamber was:

$$\beta = \text{arctg}\,[2\cdot(1.5-1.35\cdot10^{-3}\cdot342)/342] = 0.35°.$$

In the multicrystalline silicon ingot production, the melt spills fall far short of the prior art figures. The spilling that took place, stopped at short distances. As a result, multicrystalline silicon ingots thus produced had large areas of zero-defect monocrystalline silicon. The multicrystalline silicon production capacity increased by 12%.

The invention claimed is:

1. An apparatus for producing multicrystalline silicon ingots by the induction method, comprising an enclosure, which includes means for start-up heating of silicon, a cooled crucible enveloped by an inductor and having a movable bottom and four walls consisting of sections spaced apart by vertically extending slots, means for moving the movable bottom, and a controlled cooling compartment arranged under the cooled crucible wherein the inside face thereof defines a melting chamber of a rectangular or square cross-section and the walls of the cooled crucible extend outwards at least from the inductor toward the lowest portion of the cooled crucible to thereby expand the melting chamber, characterized in that each wall of the cooled crucible has a central section providing the absence of a vertically extending slot at the middle of a side of the melting chamber, and the angle β of expanding the melting chamber is defined by the equation $$\beta = \text{arctg}\,[2\cdot(k-1.35\cdot10^{-3}\cdot b)/d],$$

where
  d is the dimension of the smaller side of the rectangle or of the side of the square of the cross-section of the melting chamber at the inducer level,
  b is the dimension of the adjoining side of the cross-section of the melting chamber at the inducer level,
  k is an empirical coefficient, which is 1.5 to 2.

2. The apparatus according to claim 1, characterized in that the central section of each wall of the cooled crucible has a width of from 1/6 to 1 of the dimension of the side of the melting chamber.

* * * * *